US012783240B2

(12) United States Patent
Liao et al.

(10) Patent No.: US 12,783,240 B2
(45) Date of Patent: Nov. 3, 2026

(54) TECHNIQUES FOR HIGH-SPEED DECODING OF VARIABLE LENGTH INTEGERS

(71) Applicant: Lemon Inc., Grand Cayman (KY)

(72) Inventors: Gang Liao, Los Angeles, CA (US); Ye Liu, Los Angeles, CA (US); Yonghua Ding, Los Angeles, CA (US); Le Cai, Los Angeles, CA (US); Jianjun Chen, Los Angeles, CA (US)

(73) Assignee: Lemon Inc., Grand Cayman (KY)

( * ) Notice: Subject to any disclaimer, the term of this patent is extended or adjusted under 35 U.S.C. 154(b) by 204 days.

(21) Appl. No.: 18/667,622

(22) Filed: May 17, 2024

(65) Prior Publication Data

US 2025/0355668 A1 Nov. 20, 2025

(51) Int. Cl.

| | |
|---|---|
| ***G06F 9/30*** | (2018.01) |
| *H03M 7/40* | (2006.01) |
| *H04N 7/12* | (2006.01) |

(52) U.S. Cl.
CPC ...... *G06F 9/30149* (2013.01); *G06F 9/30038* (2023.08); *H03M 7/40* (2013.01); *H04N 7/12* (2013.01)

(58) Field of Classification Search
CPC .. G06F 9/30149; G06F 9/30038; G06F 17/30; H03M 7/40; H04N 7/12
See application file for complete search history.

(56) References Cited

U.S. PATENT DOCUMENTS 7,068,192 B1 * 6/2006 Dean ........................ H03M 7/40 707/999.1

* cited by examiner

*Primary Examiner* — Joseph J Lauture
(74) *Attorney, Agent, or Firm* — Astute IP Law Group

(57) ABSTRACT

Described are examples for decoding variable length integers including obtaining a series of bits encoding one or more variable length integers, applying a mask to the series of bits to determine a number of bytes that correspond to each of the one or more variable length integers in the series of bits, and decoding each of the one or more variable length integers based on the number of bytes that correspond to each of the one or more variable length integers.

20 Claims, 4 Drawing Sheets

TECHNIQUES FOR HIGH-SPEED DECODING OF VARIABLE LENGTH INTEGERS

BACKGROUND

The described aspects relate to variable length integers, and more particularly, mechanisms for decoding variable length integers.

Variable-length integers (varints) are a fundamental component in data storage and communication, offering space-efficient encoding of integers. Varints are extensively used in databases, file formats, network protocols, and other applications where large amounts of data are stored and/or transferred between nodes. In varint encoding, a variable number of bytes can be used to represent an integer, such as by using schemes like the Little Endian Base-128 (LEB128). LEB128 employs a sequence of bytes to encode an integer, where each byte includes 7 bits of the integer and a continuation bit to signal whether or not subsequent bytes are present for the integer. The decoding process involves reading and assembling these bytes until the continuation bit is unset, signifying the end of the integer. This approach allows smaller integers to consume fewer bytes, proving highly efficient for data sets predominantly composed of smaller integers. For example, fixed length integers can typically be 64-bits. Where integers being stored or communicated do not require 64-bits, using varints can significantly save resources.

Processing of varints, however, may require additional resources to check the continuation bit and accordingly assemble the appropriate collection of bytes. As data volumes expand exponentially, the efficiency of processing varints becomes crucial. Traditional decoding methods, involving iterative byte-by-byte processing and bitwise operations, are becoming a performance bottleneck. The computational intensity of these methods, especially in high-throughput environments, can result in significant processing overhead and inefficiency.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

In an example, a computer-implemented method for decoding variable length integers is provided that includes obtaining a series of bits encoding one or more variable length integers, applying a mask to the series of bits to determine a number of bytes that correspond to each of the one or more variable length integers in the series of bits, and decoding each of the one or more variable length integers based on the number of bytes that correspond to each of the one or more variable length integers.

In another example, an apparatus for decoding variable length integers is provided that includes one or more processors and one or more non-transitory memories with instructions thereon. The instructions upon execution by the one or more processors, cause the one or more processors to obtain a series of bits encoding one or more variable length integers, apply a mask to the series of bits to determine a number of bytes that correspond to each of the one or more variable length integers in the series of bits, and decode each of the one or more variable length integers based on the number of bytes that correspond to each of the one or more variable length integers.

In another example, one or more non-transitory computer-readable storage media are provided for storing instructions that when executed by one or more processors cause the one or more processors to execute a method for decoding variable length integers. The method comprises obtaining a series of bits encoding one or more variable length integers, applying a mask to the series of bits to determine a number of bytes that correspond to each of the one or more variable length integers in the series of bits, and decoding each of the one or more variable length integers based on the number of bytes that correspond to each of the one or more variable length integers.

To the accomplishment of the foregoing and related ends, the one or more implementations comprise the features hereinafter fully described and particularly pointed out in the claims. The following description and the annexed drawings set forth in detail certain illustrative features of the one or more implementations. These features are indicative, however, of but a few of the various ways in which the principles of various implementations may be employed, and this description is intended to include all such implementations and their equivalents.

DETAILED DESCRIPTION

Figure 1:
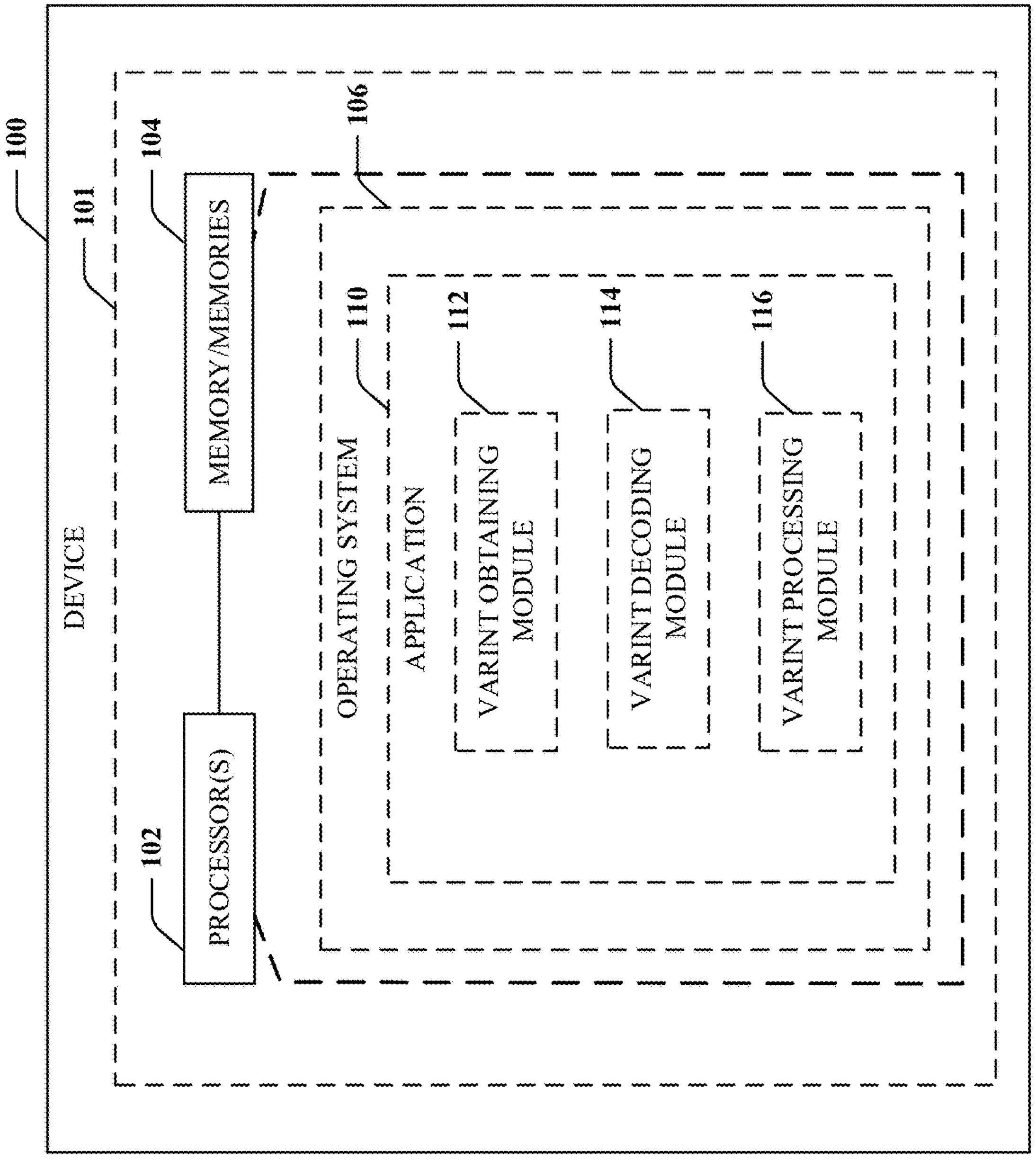
FIG. 1 is a schematic diagram of an example of a system for an example of a system for decoding variable length integers (varints), in accordance with examples described herein.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known components are shown in block diagram form in order to avoid obscuring such concepts.

This disclosure describes various examples related to increasing efficiency of decoding variable length integers (varints). In an example, native hardware instructions of a processor (e.g., a central processing unit (CPU)) can be used to perform one or more functions related to decoding varints. For example, a mask can be applied to a series of bits representing one or more varints to generate a masked value. The mask can be used to extract and combine the continuation bits associated with one or more varints, which can be used to determine the number of bytes in each of the multiple varints. Based on the masked value, the one or more varints can be more efficiently decoded from the series of bits representing the one or more varints. In some examples, the mask can be applied and/or the masked value can be generated and/or interpreted using the native hardware instructions of the processor. Using the native hardware instructions to determine the number of bytes in each varint can be more efficient that a byte-by-byte approach of evaluating each continuation bit individually and combining byte values for each byte determined to be part of the varint. This can increase efficiency of decoding the varints, which can allow for more processing resources to perform other functions related to the corresponding application or otherwise. In addition, using bit-level operations can decrease processor usage, which can improve overall system performance and allow for handling larger datasets. Moreover, efficiency can be maintained even with large data volumes, which can ensure scalability in big data applications. In addition, leveraging advanced capabilities of native hardware instructions, such as bit manipulation instructions (BMI)2 instruction set can align data processing with contemporary hardware advancements.

As used herein, a processor, at least one processor, and/or one or more processors, individually or in combination, configured to perform or operable for performing a plurality of actions is meant to include at least two different processors able to perform different, overlapping or non-overlapping subsets of the plurality actions, or a single processor able to perform all of the plurality of actions. In one non-limiting example of multiple processors being able to perform different ones of the plurality of actions in combination, a description of a processor, at least one processor, and/or one or more processors configured or operable to perform actions X, Y, and Z may include at least a first processor configured or operable to perform a first subset of X, Y, and Z (e.g., to perform X) and at least a second processor configured or operable to perform a second subset of X, Y, and Z (e.g., to perform Y and Z). Alternatively, a first processor, a second processor, and a third processor may be respectively configured or operable to perform a respective one of actions X, Y, and Z. It should be understood that any combination of one or more processors each may be configured or operable to perform any one or any combination of a plurality of actions.

As used herein, a memory, at least one memory, and/or one or more memories, individually or in combination, configured to store or having stored thereon instructions executable by one or more processors for performing a plurality of actions is meant to include at least two different memories able to store different, overlapping or non-overlapping subsets of the instructions for performing different, overlapping or non-overlapping subsets of the plurality actions, or a single memory able to store the instructions for performing all of the plurality of actions. In one non-limiting example of one or more memories, individually or in combination, being able to store different subsets of the instructions for performing different ones of the plurality of actions, a description of a memory, at least one memory, and/or one or more memories configured or operable to store or having stored thereon instructions for performing actions X, Y, and Z may include at least a first memory configured or operable to store or having stored thereon a first subset of instructions for performing a first subset of X, Y, and Z (e.g., instructions to perform X) and at least a second memory configured or operable to store or having stored thereon a second subset of instructions for performing a second subset of X, Y, and Z (e.g., instructions to perform Y and Z). Alternatively, a first memory, and second memory, and a third memory may be respectively configured to store or have stored thereon a respective one of a first subset of instructions for performing X, a second subset of instruction for performing Y, and a third subset of instructions for performing Z. It should be understood that any combination of one or more memories each may be configured or operable to store or have stored thereon any one or any combination of instructions executable by one or more processors to perform any one or any combination of a plurality of actions. Moreover, one or more processors may each be coupled to at least one of the one or more memories and configured or operable to execute the instructions to perform the plurality of actions. For instance, in the above non-limiting example of the different subset of instructions for performing actions X, Y, and Z, a first processor may be coupled to a first memory storing instructions for performing action X, and at least a second processor may be coupled to at least a second memory storing instructions for performing actions Y and Z, and the first processor and the second processor may, in combination, execute the respective subset of instructions to accomplish performing actions X, Y, and Z. Alternatively, three processors may access one of three different memories each storing one of instructions for performing X, Y, or Z, and the three processors may in combination execute the respective subset of instruction to accomplish performing actions X, Y, and Z. Alternatively, a single processor may execute the instructions stored on a single memory, or distributed across multiple memories, to accomplish performing actions X, Y, and Z.

Figure 2:
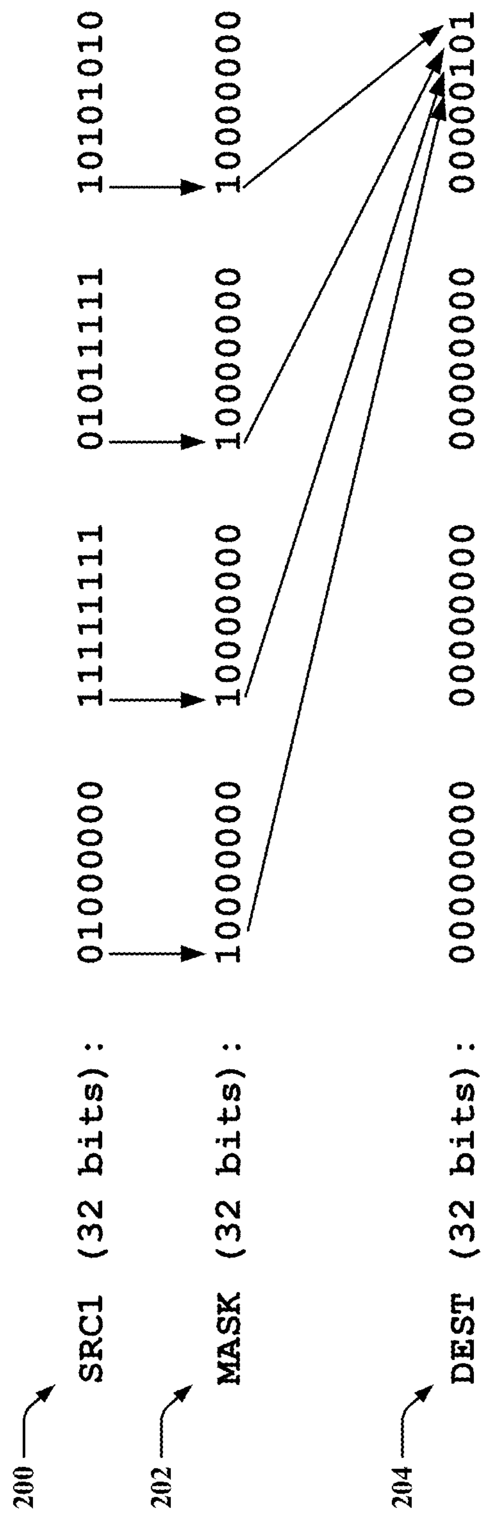
FIG. 2 illustrates an example of a PEXT operation including applying a mask to a source operand to generate a destination operand, in accordance with aspects described herein.
Figure 3:
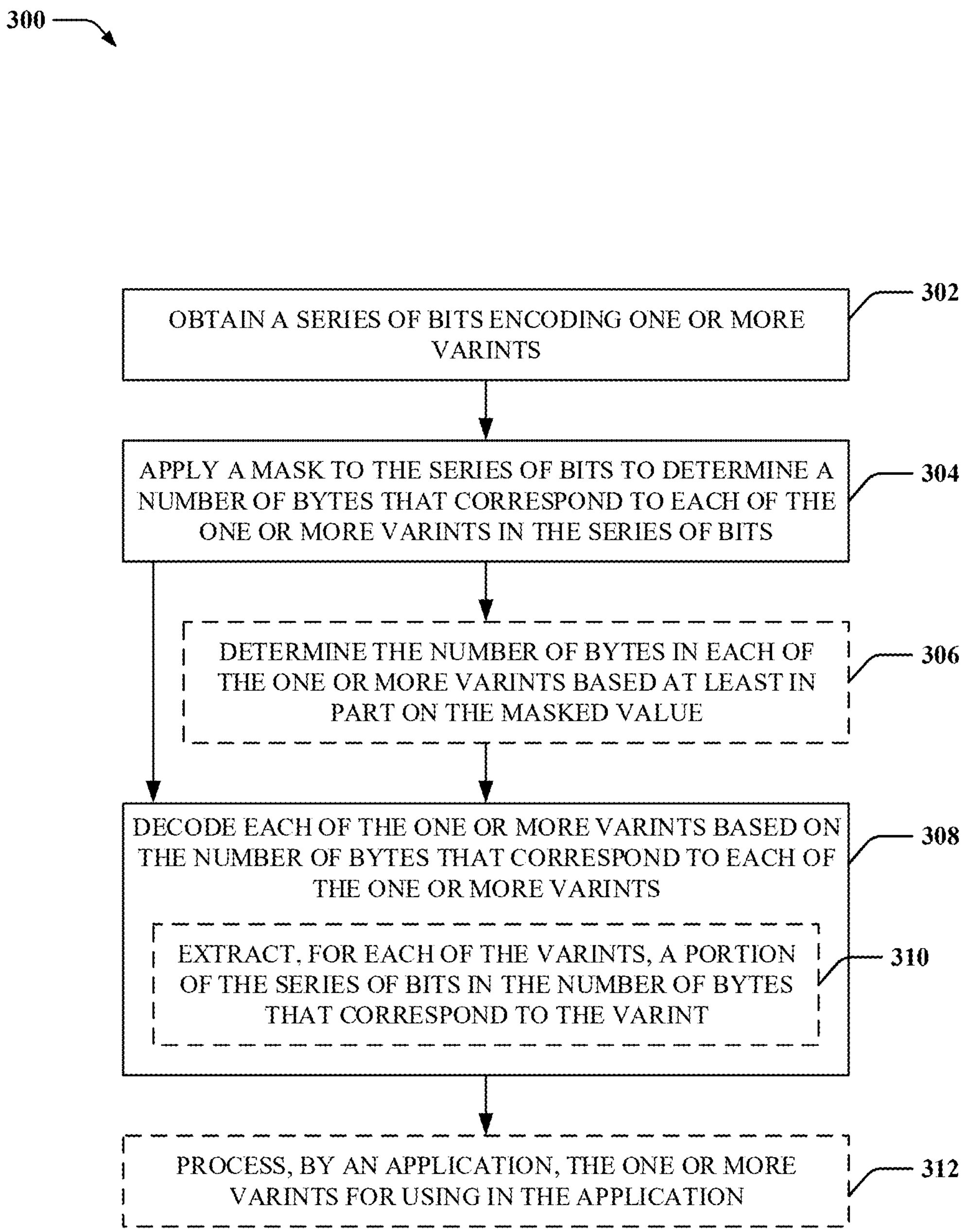
FIG. 3 is a flowchart of an example of a method for decoding one or more varint values, in accordance with examples described herein.

Turning now to FIGS. 1-4, examples are depicted with reference to one or more components and one or more methods that may perform the actions or operations described herein, where components and/or actions/operations in dashed line may be optional. Although the operations described below in FIG. 3 are presented in a particular order and/or as being performed by an example component, the ordering of the actions and the components performing the actions may be varied, in some examples, depending on the implementation. Moreover, in some examples, one or more of the actions, functions, and/or described components may be performed by a specially-programmed processor, a processor executing specially-programmed software or computer-readable media, or by any other combination of a hardware component and/or a software component capable of performing the described actions or functions.

FIG. 1 is a schematic diagram of an example of a system for decoding varints, in accordance with aspects described herein. The system includes a device 100 (e.g., a computing device) that includes processors(s) 102 (e.g., one or more processors) and/or memory/memories 104 (e.g., one or more memories). In an example, device 100 can include processor(s) 102 and/or memory/memories 104 configured to execute or store instructions or other parameters related to providing an operating system 106, which can execute one or more applications, services, etc. In another example, the device 100 can execute an application 110, e.g., via operating system 106. For example, the application 110 may include a user application that receives and processes varints, such as varints stored in a database (not shown), varints communicated using a network communication protocol, varints stored in multimedia (e.g., video and/or audio) packet data, varints used in big data analytics, etc.

For example, processor(s) 102 and memory/memories 104 may be separate components communicatively coupled by a bus (e.g., on a motherboard or other portion of a computing device, on an integrated circuit, such as a system on a chip (SoC), etc.), components integrated within one another (e.g., processor(s) 102 can include the memory/memories 104 as an on-board component 101), and/or the like. In other examples, processor(s) 102 can include multiple processors 102 of multiple devices 100, memory/memories 104 can include multiple memories 104 of multiple devices 100, etc. Memory/memories 104 may store instructions, parameters, data structures, etc., for use/execution by processor(s) 102 to perform functions described herein.

In addition, the device 100 can include substantially any device that can have a processor(s) 102 and memory/memories 104, such as a computer (e.g., workstation, server, personal computer, etc.), a personal device (e.g., cellular phone, such as a smart phone, tablet, etc.), a smart device, such as a smart television, and/or the like. Moreover, in an example, various components or modules of the device 100 may be within a single device, as shown.

In an example, the operating system 106 and/or an application 110 executing on the operating system 106 can include one or more of a varint obtaining module 112 for obtaining one or more varints from storage (e.g., memory/memories 104, a database storage, etc.), from a received data packet, etc., a varint decoding module 114 for decoding the one or more varints at least in part by applying a mark to a series of bits that include the one or more varints, and/or a varint processing module 116 for processing the one or more varints as decoded, which may include application 110 using the varint in a sequence of compiled instructions being executed. In one example, given a series of bits that correspond to one or more varints, varint decoding module 114 can apply the mask, to generate a masked value, using one or more native hardware instructions of the processor(s) 102. In an example, varint decoding module 114 can use the masked value to determine a number of bytes in the varint, and can accordingly decode the integer value from the series of bits based on the number of bytes. This can allow for a more efficient decoding of varints. For example, modern processors may offer BMI, or more specifically BMI2 instructions, which may include parallel bit deposit (PDEP) or parallel bit extraction (PEXT). PDEP can streamline the process of depositing bits from a source operand into a destination operand based on a mask. PDEP can allow for selectively placing bits in specific positions, enabling precise control over bit placement. PDEP can be particularly useful in scenarios where bits from a variable need to be reorganized or masked in a specific pattern. PEXT can enable extraction of bits from a source operand based on a mask. PEXT can allow for the selective extraction of bits, effectively filtering the source operand through the mask to produce the desired bit pattern in the destination operand. PEXT can be useful for operations that require isolating specific bits from a larger set, such as decoding varints where bits need to be extracted from a sequence of bytes.

FIG. 2 illustrates an example of a PEXT operation including applying a mask to a source operand to generate a destination operand, in accordance with aspects described herein. In FIG. 2, given source operand 200, a mask 202 can be applied to generate destination operand 204. In an example, the mask 202 can have a one value set in each most significant bit of each byte. For example, the mask 202 can be 64-bit (e.g., 8-byte, though 4 bytes are shown in FIG. 2 for ease of explanation) and can have zero values in the 7 least significant bits (or lowest order bits) of each byte and a one value in the most significant bit of each byte. In this example, where the source operand 200 represents one or more varints, applying the mask 202 to the source operand 200 can result in the destination operand 204 having its least significant bits representing the collection of continuation bits of the one or more varints (e.g., in the example of a 4-byte mask 202, the least significant 4 bits can represent the continuation bits). In this example, as the mask 202 uses 1 value bit at each continuation bit position of a byte for 4 bytes, the result of applying the mask 202 to the source operand 200 can group the continuation bits for each byte as a bit in the 4 least significant bits in the destination operand 204. Using this information, as described further herein, a varint decoding module 114 can efficiently determine the number of bytes in each varint in the series of bits in the source operand 200.

FIG. 3 is a flowchart of an example of a method 300 for decoding one or more varint values, in accordance with aspects described herein. For example, method 300 can be performed by a device 100 executing operating system 106 or application 110 and having one or more processors 102 with native hardware instructions for extracting bits using a mask.

In method 300, at action 302, a series of bits encoding one or more varints can be obtained. For example, varint obtaining module 112, e.g., in conjunction with processor(s) 102, memory/memories 104, operating system 106, application 110, etc., can obtain the series of bits encoding the one or more varints. For example, varint obtaining module 112 can obtain the one or more varints from memory/memories 104, from a database, from another storage, from a packet received from another device via a network, etc. In an example, the one or more varints as obtained can include a series of bits that can represent integers in one or more bytes. For example, a bit of the one or more bytes can be used as a continuation bit, which may be the highest order bit in the byte or another bit. When the continuation bit is set, this can indicate that the varint also includes the next byte, and so on, until a zero value bit is encounter in the continuation bit for a byte. In an example, as described, the one or more varints may be encoded using LEB128.

In method 300, at action 304, a mask can be applied to the series of bits to determine a number of bytes that correspond to each of the one or more varints in the series of bits. For example, varint decoding module 114, e.g., in conjunction with processor(s) 102, memory/memories 104, operating system 106, application 110, etc., can apply the mask to the series of bits to determine a number of bytes that correspond to each of the one or more varints in the series of bits. In one example, as described, the mask can include a series of bits of multiple bytes having zero value for the seven least significant bits of each byte and a one value for the highest order bit of each byte (e.g., as shown in mask 202). In one example, the mask can be 6 bytes, but other sizes are possible to allow for decoding varints from a larger or smaller series of bits. In an example, in applying the mask, varint decoding module 114 can generate a masked value that includes a number of least significant bits that represent, in series, the continuation bits of the series of bits of the one or more varints. This value can be used to quickly determine the values of the continuation bits in the series of bits, and the one or more varints can be efficiently decoded from the series of bits based on this masked value.

In method 300, optionally at action 306, the number of bytes in each of the one or more varints can be determined based at least in part on the masked value. For example, varint decoding module 114, e.g., in conjunction with processor(s) 102, memory/memories 104, operating system 106, application 110, etc., can determine the number of bytes in each of the one or more varints based at least in part on the masked value. For example, varint decoding module 114 can compare the masked value to a known value to determine a number of varints in the series of bits, the number of bytes used by each varint, etc. For example, a masked value of zero may indicate that no varint has a continuation bit set, and thus each byte in the series of bits represents a varint. In this regard, the number of bytes storing a varint can be represented by the number of consecutive continuation bits in the masked value plus one. Thus, in another example, a masked value of 15 (in decimal base, which is 1111 in binary) may indicate that the first five bytes store one varint (e.g., the fourth consecutive bit with the one value can indicate that there is one byte or more in the varint). Similarly, in an example, a masked value having a binary representation with a 1 value in the highest least significant bit corresponding to the number of bytes in the source operand and/or the mask can indicate that the varint continues into a next source operand, which may also have one or more continuation bits that can indicate whether additional bytes are to be combined with the previously processed varint.

In method 300, at action 308, each of the one or more varints can be decoded based on the number of bytes that correspond to each of the one or more varints. For example, varint decoding module 114, e.g., in conjunction with processor(s) 102, memory/memories 104, operating system 106, application 110, etc., can decode each of the one or more varints based on the number of bytes that correspond to each of the one or more varints. For example, varint decoding module 114 can extract each varint from the series of bits (or from one or more additional series of bits) based on the number of bytes per varint indicated in the masked value. In one example, multiple varints can be decoded from the series of bits, based on the corresponding number of bytes, in parallel, which can provide additional efficiency over byte-by-byte approaches to decoding varints.

In decoding the number of bytes that correspond to each varint at action 308, optionally at action 310, a portion of the series of bits in the number of bytes that correspond to the varint can be extracted for each of the varints. For example, varint decoding module 114, e.g., in conjunction with processor(s) 102, memory/memories 104, operating system 106, application 110, etc., can extract, for each of the varints, the portion of the series of bits in the number of bytes that correspond to the varint. For example, varint decoding module 114 for a given number of bytes determined for a varint, varint decoding module 114 can obtain the number of bytes, move a pointer to the starting bit of the byte(s) based on the determined number of bytes, etc. In one example, can obtain the 7 least significant bits of each byte for the number of bytes, and combine these bits to generate the decoded varint value. This may be more efficient that extracting bits, checking the continuation bit, extracting the next set of bits where the continuation bit is determined to have a value of one, etc., as described. In an example, varint decoding module 114 can leverage BMI2 instructions, such as PEXT, to enhance the speed and efficiency of varint decoding processes in this regard. For example, varint decoding module 114 can iteratively apply BMI2 instructions to process 64-bit data blocks, extracting and reconstructing varints.

Moreover, in an example, in decoding one or more varints, varint decoding module 114 can perform shift operations and/or partial value storage to handle varints that cross a boundary of the series of bits. For example, as described, the series of bits may be limited and/or a portion of a varint may span across multiple series of bits. Where varint decoding module 114 encounters a masked value indicating a continuation bit in the nth bit position of the masked value for a mask of length n (e.g., sixth bit position for 6-bit mask), for example, this can indicate the varint spans from a previous series of bits to a current series of bits. Thus, in one example, varint decoding module 114 can use partial value storage to store a last byte(s) value for a previous series of bits in case the nth bit position for the next masked value is one, and varint decoding module 114 can merge the number of bytes determined for the varint from the current series of bits, based on the next masked value, to a partial value from a previous series of bits to complete integer represented by the varint. In this regard, cross-boundary varints can also be reconstructed by varint decoding module 114. In any case, varint decoding module 114 can assemble the decoded integers into a final output format.

In method 300, optionally at action 312, the one or more varints can be processed, by an application, for using in the application. For example, varint processing module 116, e.g., in conjunction with processor(s) 102, memory/memories 104, operating system 106, application 110, etc., can process, by an application or for the application (e.g., application 110), the one or more varints for using in the application. For example, the application 110 may call (e.g., via varint processing module 116) a varint decoding function provided by the varint decoding module 114 on a series of bits, and the varint decoding module 114 can accordingly provide the one or more varints represented in the series of bits. In an example, varint processing module 116 can use the one or more varints in compiled code being executed by the application 110, etc.

In accordance with aspects described above, varint decoding can be performed by employing BMI2 to perform bulk bitwise operations, which can be more efficient than the traditional byte-by-byte decoding approach. In one example, configurable 64-bit masks can be used to efficiently extract the most significant bits from byte sequences, optimizing the decoding process for varints encoded across multiple bytes. In addition, for example, sophisticated handling of varints that span across 64-bit data block boundaries can be provided to ensure accurate reconstruction of integers. Moreover, for example, parallel processing capabilities of BMI2 can be utilized to simultaneously decode multiple varints, which can reduce processing cycles and enhance throughput.

In one example, the varint decoding module 114 can be specifically designed for bulk processing with a 6-byte mask configuration. The following pseudocode is an example of an algorithm that can be performed by the varint decoding module 114 that encapsulates the decoding process, integrating the handling of cross-boundary cases and leveraging the full potential of BMI2 instructions for enhanced efficiency and speed.

```
Input: uint64_t b, BufferPointer buf, T* res (unit32/uint64)
Output: Updated BufferPointer in the data stream
mask_length = 6; mask = 0x0000808080808080;
shift_bits = 0; pt_val = partial_value = 0;
buf −= mask_length;
while n >= 8 do
      buf += mask_length;
      word = *(const uint64_t*)(buf);
      //apply the mask to the integer to pull the continuation
      //bits to mval
      mval = pext_u64 (word, mask);
         switch (mval)
```

-continued

```
11:             case 0: //no continuation bit
12:                 cu__val = __pext u64(word, 0x000000000000007f);
13:                 *res++ = (cu__val << shift bits) | pt__val;
14:                 *res++ = __pext u64(word, 0x0000000000007f00);
15:                 *res++ = __pext__u64(word, 0x00000000007f0000);
16:                 *res++ = __pext__u64(word, 0x0000000071000000);
17:                 *res++ = __pext__u64(word, 0x0000007f00000000);
18:                 *res++ = __pext__u64(word, 0x00007f0000000000);
19:                 shift__bits = 0; pt__val = 0; n −= 6;
20:             case 15:
21:             //4 continuation bits, but terminating by the fifth bit
22:                 cu__val = __pext__u64(word, 0x0000007f7f7f7f7f);
23:                 *res++ = (cu__val << shift__bits) | pt__val;
24:                 *res++ = __pext__u64(word, 0x00007f0000000000);
25:                 shift__bits = 0; pt__val = 0; n −= 2;
26:             case 32:
27:             //1 continuation bit in the sixth bit
28:                 cu__val = __pext__u64(word, 0x000000000000007f);
29:                 *res++ = (cu__val << shift__bits) | pt__val;
30:                 *res++ = __pext__u64(word, 0x0000000000000700);
31:                 *res++ = __pext__u64(word, 0x00000000007f0000);
32:                 *res++ = __pext__u64(word, 0x000000007f000000);
33:                 *res++ = __pext__u64(word, 0x0000007f00000000);
34:                 pt__val = __pext__u64(word, 0x00007f0000000000);
35:                 shift__bits = 7; n −= 5;
36:             case 45:
37:             //continuation bits in the first, third, fourth and sixth
38:             //bits
39:                 cu__val = __pext__u64(word, 0x0000000000007f7f);
40:                 *res++ = (cu__val << shift__bits) | pt__val;
41:                 *res++ = __pext__u64(word, 0x0000007f7f7f0000);
42:                 pt__val = __pext__u64(word, 0x00007f0000000000);
43:                 shift__bits = 0; n −= 2;
44:             case 62:
45:             //continuation bits in the second, third, fourth, fifth
46:             //and sixth bits
47:                 cu__val = __pext__u64(word, 0x000000000000007f);
48:                 *res++ = (cu__val << shift__bits) | pt__val;
49:                 pt__val = __pext__u64(word, 0x00007f7f7f7f7f00);
50:                 shift__bits = 35; n −= 1;
51:             case 63:
52:             //continuation bits in the first through sixth bits
53:                 pt__val |= __pext__u64(word, 0x00007f7f7f7f7f7f)
54:                   << shift__bits;
55:                 shift__bits += 42;
56:             //Other cases omitted for brevity
57:             case ...
58:         end while
```

For example, in line 7, the _pext_u64 can be a PEXT instruction natively supported by the processor(s) 102 that extracts most significant bits from the 64-bit word (e.g., the series of bits) representing the varint in accordance with the specified mask. The mask value, represented as hexadecimal value 0x0000808080808080 is the same as a value having bit one values at the most significant bit position of each of six bytes (only the least significant 6 bytes is used as the mask and the most significant 2 bytes are all 0s, thus no mask), as described. The output from this operation, the masked value, can accordingly identify the structure of varints within the current data block, indicating both the count and distribution of integers present. Subsequently, the algorithm can utilize this information (the masked value, also referred to as mval) in a switch-case structure to tailor the decoding process for each integer, adapting to their specific encoding patterns within the data stream. For example, in lines 38-42, the algorithm can manage a case where a significant portion of an integer is encoded in the preceding 64-bit block, with a smaller segment extending into the current block. For example, the binary representation of 62 under a 6-byte mask can be 111110. The final bit being 0 can signal the termination of an integer within the current block. This leads to lines 39-40, where the current block's value, extracted using _pext_u64, is merged with the partial value from the previous block, completing the integer. Furthermore, if the pattern of the upper five bits of the masked value (mval) are all ones (11111), this can suggest the current block includes a new integer that does not conclude within the block. To address this, lines 41 and 42 extract the ongoing integer's portion that extends into the next block. Here, _pext_u64 is used to isolate this segment, storing it in pt_val for future decoding. The shift_bits is set to 35, corresponding to the five 7-byte sequences, to correctly position the decoding process for the next block. Concurrently, the decrement in n by 1 accounts for the completion of decoding one integer in the current data block, ensuring the algorithm's continuity and accuracy in handling integers spanning multiple blocks. In the scenario represented by case 63, lines 44-45 address a situation where the binary representation is 111111, indicating that the integer spans across three data blocks, and the current block is the middle segment of the integer. This specific case can result in extracting six bytes (or 42 bits) of data from the block using the _pext_u64 instruction. The extracted data can then be appended to the partial value, ensuring the continuity of the integer across these multiple blocks.

The pseudocode above shows cases for mval=0, 15, 32, 45, 62, and 63, though varint decoding module 114 can include cases for more values of mval (e.g., all values of mval 0-63 for 64-bit mask), which can be similarly implemented to perform the desired functionality described herein. In addition, though aspects are generally described herein for a 6-byte mask and assuming that n bytes (e.g., n=8) are processed in one batch each time, the concepts, algorithms, and function can similarly be applied for substantially any value of n>0 bytes, and mask size <=n bytes.

Figure 4:
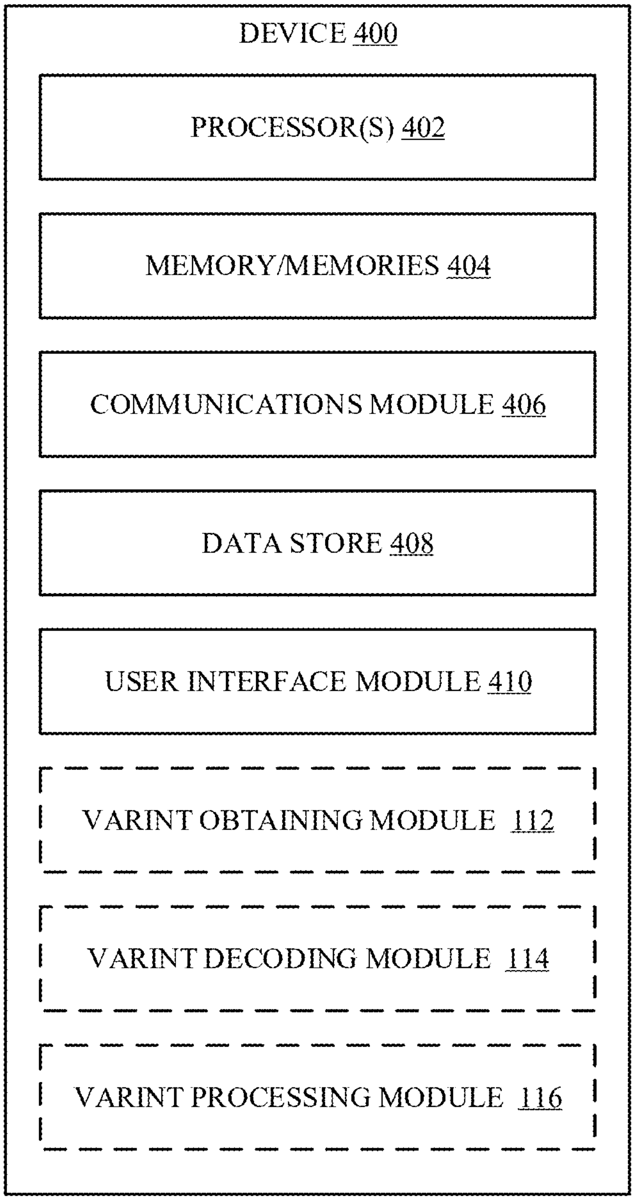
FIG. 4 is a schematic diagram of an example of a device for performing functions described herein.

FIG. 4 illustrates an example of device 400, similar to or the same as device 100 (FIG. 1), including additional optional component details as those shown in FIG. 1. In one implementation, device 400 may include processor(s) 402, which may be similar to processor(s) 102 for carrying out processing functions associated with one or more of components and functions described herein. Processor(s) 402 can include a single or multiple set of processors or multicore processors. Moreover, processor(s) 402 can be implemented as an integrated processing system and/or a distributed processing system.

Device 400 may further include memory/memories 404, which may be similar to memory/memories 104 such as for storing local versions of applications being executed by processor(s) 402, application 110, varint obtaining module 112, varint decoding module 114, varint processing module 116, related modules, instructions, parameters, etc. Memory/memories 404 can include a type of memory usable by a computer, such as random access memory (RAM), read only memory (ROM), tapes, magnetic discs, optical discs, volatile memory, non-volatile memory, and any combination thereof.

Further, device 400 may include a communications module 406 that provides for establishing and maintaining communications with one or more other devices, parties, entities, etc., utilizing hardware, software, and services as described herein. Communications module 406 may carry communications between modules on device 400, as well as between device 400 and external devices, such as devices located across a communications network and/or devices serially or locally connected to device 400. For example, communications module 406 may include one or more buses, and may further include transmit chain modules and receive chain modules associated with a wireless or wired transmitter and receiver, respectively, operable for interfacing with external devices.

Additionally, device 400 may include a data store 408, which can be any suitable combination of hardware and/or software, that provides for mass storage of information, databases, and programs employed in connection with implementations described herein. For example, data store 408 may be or may include a data repository for applications and/or related parameters (e.g., application 110, varint obtaining module 112, varint decoding module 114, varint processing module 116, related modules, instructions, parameters, etc.) being executed by, or not currently being executed by, processor(s) 402. In addition, data store 408 may be a data repository for application 110, varint obtaining module 112, varint decoding module 114, varint processing module 116, related modules, instructions, parameters, etc., and/or one or more other modules of the device 400.

Device 400 may include a user interface module 410 operable to receive inputs from a user of device 400 and further operable to generate outputs for presentation to the user. User interface module 410 may include one or more input devices, including but not limited to a keyboard, a number pad, a mouse, a touch-sensitive display, a navigation key, a function key, a microphone, a voice recognition component, a gesture recognition component, a depth sensor, a gaze tracking sensor, a switch/button, any other mechanism capable of receiving an input from a user, or any combination thereof. Further, user interface module 410 may include one or more output devices, including but not limited to a display, a speaker, a haptic feedback mechanism, a printer, any other mechanism capable of presenting an output to a user, or any combination thereof.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more implementations, one or more of the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), and floppy disk where disks usually reproduce data magnetically, while discs reproduce data optically with lasers. Combinations of the above should also be included within the scope of computer-readable media.

The previous description is provided to enable any person skilled in the art to practice the various implementations described herein. Various modifications to these implementations will be readily apparent to those skilled in the art, and the generic principles defined herein may be applied to other implementations. Thus, the claims are not intended to be limited to the implementations shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various implementations described herein that are known or later come to be known to those of ordinary skill in the art are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A computer-implemented method for decoding variable length integers, comprising:

obtaining a series of bits encoding one or more variable length integers;

applying a mask to the series of bits to determine a number of bytes that correspond to each of the one or more variable length integers in the series of bits, wherein the mask includes a bit of each of multiple bytes having a value of one; and decoding each of the one or more variable length integers based on the number of bytes that correspond to each of the one or more variable length integers.

2. The computer-implemented method of claim 1, wherein applying the mask to the series of bits generates a masked value with one or more lowest order bits having a value of the bit of each of the multiple bytes.

3. The computer-implemented method of claim 2, further comprising determining the number of bytes in each of the one or more variable length integers based at least in part on the masked value.

4. The computer-implemented method of claim 2, wherein applying the mask includes performing, by one or more processors, a native hardware instruction of the one or more processors to generate the masked value.

5. The computer-implemented method of claim 4, wherein the native hardware instruction includes a parallel bit extract function that extracts bits from the series of bits based on the mask into the masked value.

6. The computer-implemented method of claim 2, wherein decoding one variable length integer of the one or more variable length integers includes combining, based on the masked value, a portion of the series of bits that corresponds to the one variable length integer with a portion of a previous series of bits.

7. The computer-implemented method of claim 1, wherein decoding each of the one or more variable length integers includes extracting, for each of the variable length integers, a portion of the series of bits in the number of bytes that correspond to the variable length integer.

8. An apparatus for decoding variable length integers, the apparatus comprising one or more processors and one or more non-transitory memories with instructions thereon, wherein the instructions upon execution by the one or more processors, cause the one or more processors to:

obtain a series of bits encoding one or more variable length integers;

apply a mask to the series of bits to determine a number of bytes that correspond to each of the one or more variable length integers in the series of bits, wherein the mask includes a bit of each of multiple bytes having a value of one; and decode each of the one or more variable length integers based on the number of bytes that correspond to each of the one or more variable length integers.

9. The apparatus of claim 8, wherein the instructions upon execution by the one or more processors, cause the one or more processors to apply the mask to the series of bits to generate a masked value with one or more lowest order bits having a value of the bit of each of the multiple bytes.

10. The apparatus of claim 9, wherein the instructions upon execution by the one or more processors, cause the one or more processors to determine the number of bytes in each of the one or more variable length integers based at least in part on the masked value.

11. The apparatus of claim 9, wherein the instructions upon execution by the one or more processors, cause the one or more processors to apply the mask including performing, by one or more processors, a native hardware instruction of the one or more processors to generate the masked value.

12. The apparatus of claim 11, wherein the native hardware instruction includes a parallel bit extract function that extracts bits from the series of bits based on the mask into the masked value.

13. The apparatus of claim 9, wherein the instructions upon execution by the one or more processors, cause the one or more processors to decode one variable length integer of the one or more variable length integers including combining, based on the masked value, a portion of the series of bits that corresponds to the one variable length integer with a portion of a previous series of bits.

14. The apparatus of claim 8, wherein the instructions upon execution by the one or more processors, cause the one or more processors to decode each of the one or more variable length integers including extracting, for each of the variable length integers, a portion of the series of bits in the number of bytes that correspond to the variable length integer.

15. One or more non-transitory computer-readable storage media storing instructions that when executed by one or more processors cause the one or more processors to execute a method for decoding variable length integers, wherein the method comprises:

obtaining a series of bits encoding one or more variable length integers;

applying a mask to the series of bits to determine a number of bytes that correspond to each of the one or more variable length integers in the series of bits, wherein the mask includes a bit of each of multiple bytes having a value of one; and decoding each of the one or more variable length integers based on the number of bytes that correspond to each of the one or more variable length integers.

16. The one or more non-transitory computer-readable storage media of claim 15, wherein applying the mask to the series of bits generates a masked value with one or more lowest order bits having a value of the bit of each of the multiple bytes.

17. The one or more non-transitory computer-readable storage media of claim 16, the method further comprising determining the number of bytes in each of the one or more variable length integers based at least in part on the masked value.

18. The one or more non-transitory computer-readable storage media of claim 16, wherein applying the mask includes performing, by one or more processors, a native hardware instruction of the one or more processors to generate the masked value.

19. The one or more non-transitory computer-readable storage media of claim 18, wherein the native hardware instruction includes a parallel bit extract function that extracts bits from the series of bits based on the mask into the masked value.

20. The one or more non-transitory computer-readable storage media of claim 16, wherein decoding one variable length integer of the one or more variable length integers includes combining, based on the masked value, a portion of the series of bits that corresponds to the one variable length integer with a portion of a previous series of bits.

* * * * *